US010033381B2

(12) United States Patent
Breed et al.

(10) Patent No.: US 10,033,381 B2
(45) Date of Patent: Jul. 24, 2018

(54) WIRELESS SWITCHES USING HUMAN BODY AS A CONDUCTOR

(71) Applicant: Intelligent Technologies International, Inc., Miami Beach, FL (US)

(72) Inventors: David S Breed, Miami Beach, FL (US); Wendell C Johnson, San Pedro, CA (US); Wilbur E DuVall, Katy, TX (US)

(73) Assignee: Intelligent Technologies International, Inc., Miami Beach, FL (US)

( * ) Notice: Subject to any disclaimer, the term of this patent is extended or adjusted under 35 U.S.C. 154(b) by 0 days.

(21) Appl. No.: 15/440,144

(22) Filed: Feb. 23, 2017

(65) Prior Publication Data
US 2017/0163259 A1    Jun. 8, 2017

Related U.S. Application Data

(63) Continuation of application No. PCT/US2015/059884, filed on Nov. 10, 2015, which
(Continued)

(51) Int. Cl.
*H03K 17/96* (2006.01)
*H03K 17/955* (2006.01)
(Continued)

(52) U.S. Cl.
CPC ........... *H03K 17/955* (2013.01); *B60N 2/002* (2013.01); *B60N 2/0228* (2013.01); *B60N 2/24* (2013.01);
(Continued)

(58) Field of Classification Search
CPC ............... H03K 17/955; H03K 17/962; H03K 2217/960755; H03K 2217/9455; B60R 16/023
See application file for complete search history.

(56) References Cited

U.S. PATENT DOCUMENTS

| 3,944,843 A | 3/1976 | Vaz Martins |
| 4,069,659 A | 1/1978 | Harris et al. |

(Continued)

FOREIGN PATENT DOCUMENTS

| JP | 2005027095 A | 1/2005 |
| JP | 2006271798 A | 10/2006 |

(Continued)

OTHER PUBLICATIONS

Maeda et al., Controller of Onboard Equipment, Jul. 12, 2007, JPO, JP 2007-176323 A, English Abstract (Year: 2007).*

(Continued)

*Primary Examiner* — James A English
(74) *Attorney, Agent, or Firm* — Brian Roffe

(57) ABSTRACT

Arrangement for controlling a component having multiple states includes a device that generates a signal at a frequency that enables it to be conducted through a human body, and a conductive surface coupled to the device, situated in a position accessible by a part of the human, and which enables proximity or contact of the part of the human to the conductive surface to develop a reactive coupling between the human and the conductive surface. The component has multiple, different states and is controlled by the human to change from a first state to a second state upon completion of an electrical circuit including the component, the conductive surface and the device upon developing reactive coupling between the human and the conductive surface when the device is generating the signal conducted through the human. The component may be a vehicular component such as a door or window.

20 Claims, 5 Drawing Sheets

Related U.S. Application Data is a continuation of application No. 14/932,083, filed on Nov. 4, 2015, now Pat. No. 9,475,438.

(60) Provisional application No. 62/079,685, filed on Nov. 14, 2014.

(51) Int. Cl.

| | | |
|---|---|---|
| *B60N 2/75* | (2018.01) | |
| *B60N 2/24* | (2006.01) | |
| *B60R 16/03* | (2006.01) | |
| *B62D 1/04* | (2006.01) | |
| *B62D 25/14* | (2006.01) | |
| *B60N 2/00* | (2006.01) | |
| *B60N 2/02* | (2006.01) | |
| *B60R 16/023* | (2006.01) | |
| *H03K 17/945* | (2006.01) | |

(52) U.S. Cl.
CPC ............ *B60N 2/797* (2018.02); *B60R 16/023* (2013.01); *B60R 16/03* (2013.01); *B62D 1/046* (2013.01); *B62D 25/14* (2013.01); *H03K 17/962* (2013.01); *H03K 2017/9455* (2013.01); *H03K 2217/960755* (2013.01)

(56) References Cited

U.S. PATENT DOCUMENTS

| | | | |
|---|---|---|---|
| 4,160,923 A | 7/1979 | Maeda et al. | |
| 5,279,284 A | 1/1994 | Fenn | |
| 5,477,727 A | 12/1995 | Koga | |
| 5,621,290 A | 4/1997 | Heller et al. | |
| 5,857,061 A | 1/1999 | Chang et al. | |
| 6,218,947 B1 | 4/2001 | Sutherland | |
| 6,223,018 B1 | 4/2001 | Fukumoto et al. | |
| 6,263,271 B1 | 7/2001 | Oka et al. | |
| 6,326,704 B1 | 12/2001 | Breed et al. | |
| 6,377,009 B1 | 4/2002 | Philipp | |
| 6,378,900 B1 | 4/2002 | Stanley et al. | |
| 6,429,782 B2 | 8/2002 | Pavatich et al. | |
| 6,437,270 B1 | 8/2002 | Morrison et al. | |
| 6,501,281 B1 | 12/2002 | Rundo | |
| 6,621,029 B2 | 9/2003 | Galmiche et al. | |
| 6,684,973 B2 | 2/2004 | Baba et al. | |
| 6,794,728 B1 | 9/2004 | Kithil | |
| 6,816,077 B1 | 11/2004 | Shieh et al. | |
| 6,950,710 B2 | 9/2005 | Shirakawa et al. | |
| 6,960,841 B2 | 11/2005 | Saitou et al. | |
| 7,079,450 B2 | 7/2006 | Breed et al. | |
| 7,089,099 B2 | 8/2006 | Shostak et al. | |
| 7,103,460 B1 | 9/2006 | Breed | |
| 7,467,034 B2 | 12/2008 | Breed et al. | |
| 7,518,381 B2 | 4/2009 | Lamborghini et al. | |
| 7,545,270 B2 | 6/2009 | Pickering et al. | |
| 7,760,080 B2 | 7/2010 | Breed et al. | |
| 7,786,864 B1 | 8/2010 | Shostak et al. | |
| 7,795,882 B2 | 9/2010 | Kirchner et al. | |
| 7,880,594 B2 | 2/2011 | Breed et al. | |
| 7,889,096 B2 | 2/2011 | Breed | |
| 7,920,102 B2 | 4/2011 | Breed | |
| 8,032,264 B2 | 10/2011 | Breed | |
| 8,068,942 B2 | 11/2011 | Breed | |
| 8,078,362 B2 | 12/2011 | Yamanaka et al. | |
| 8,410,794 B2 | 4/2013 | Nakayama et al. | |
| 8,456,180 B2 | 6/2013 | Sitarski | |
| 8,519,725 B2 | 8/2013 | Uno et al. | |
| 8,626,261 B2 | 1/2014 | Ko et al. | |
| 8,665,077 B2 | 3/2014 | Richter | |
| 8,725,311 B1 | 5/2014 | Breed | |
| 8,786,573 B2 | 7/2014 | Kobayashi et al. | |
| 8,836,527 B2 | 9/2014 | Wendt et al. | |
| 8,975,903 B2 | 3/2015 | Salter et al. | |
| 8,994,689 B2 | 3/2015 | Pandher et al. | |
| 9,065,447 B2 | 6/2015 | Buttolo et al. | |
| 9,106,328 B2 | 8/2015 | Kataoka et al. | |
| 9,136,840 B2 | 9/2015 | Salter et al. | |
| 9,143,126 B2 | 9/2015 | Salter et al. | |
| 9,475,438 B2 | 10/2016 | Breed et al. | |
| 2002/0080014 A1* | 6/2002 | McCarthy | B60N 2/002 340/426.1 |
| 2003/0025588 A1 | 2/2003 | Meier et al. | |
| 2004/0056758 A1 | 3/2004 | Schwartz | |
| 2006/0028453 A1 | 2/2006 | Kawabe | |
| 2006/0261672 A1 | 11/2006 | Richter | |
| 2008/0088413 A1 | 4/2008 | Richter | |
| 2008/0204117 A1* | 8/2008 | Richter | H04B 13/005 327/517 |
| 2009/0096468 A1 | 4/2009 | Hirota et al. | |
| 2010/0044120 A1 | 2/2010 | Richter | |
| 2010/0188242 A1 | 7/2010 | Petereit et al. | |
| 2010/0207754 A1 | 8/2010 | Shostak et al. | |
| 2011/0012621 A1* | 1/2011 | Richter | B60R 21/01532 324/675 |
| 2011/0121958 A1 | 5/2011 | Waller et al. | |
| 2013/0027065 A1* | 1/2013 | Stanley | B60N 2/002 324/705 |
| 2013/0222156 A1 | 8/2013 | Colburn, III | |
| 2016/0028347 A1* | 1/2016 | Okamoto | H03B 5/24 331/108 R |

FOREIGN PATENT DOCUMENTS

| | | |
|---|---|---|
| JP | 2007176323 A | 7/2007 |
| JP | 2011168139 A | 9/2011 |
| JP | 2012121459 A | 6/2012 |
| WO | 2016077304 A1 | 5/2016 |

OTHER PUBLICATIONS

Maeda et al., Controller of Onboard Equipment, Jul. 12, 2007, JPO, JP 2007-176323 A, Machine Translation of Description (Year: 2007).*
Abstract of JP 2005027095.
Abstract of JP 2006271798.
Abstract of JP 2007176323.
Abstract of JP 2011168139.
Abstract of JP 2012121459.
Search Report for PCT/US2015/059884 dated Dec. 28, 2015.
Written Opinion for PCT/US2015/059884 dated Dec. 28, 2015.
Tonami et al., Contact Type Individual Authentication Method, Jan. 27, 2005, JPO, JP 2005-027095 A, Machine Translation of Description.
Maeda et al., Controller of Onboard Equipment, Jul. 12, 2007, JPO, JP 2007-176323 A, Machine Translation of Description.
Mitsuhayashi et al., Biological Information Processing System, Oct. 12, 2016, JPO, JP 2006-271798 A, Machine Translation of Description.
Yamada et al., Switch for Seat, Electric Seat Equipped With the Same, Jun. 28, 2012, JPO, JP 2012-121459 A, Machine Translation of Description.
Enabling On-Body Transmissions with Commodity Devices, Mehrdad Hessar, Vikram Iyer, Shyamnath Gollakota University of Washington, UbiComp '16, Sep. 12-16, 2016, Heidelberg, Germany, © 2016 ACM.

* cited by examiner

FIG. 6
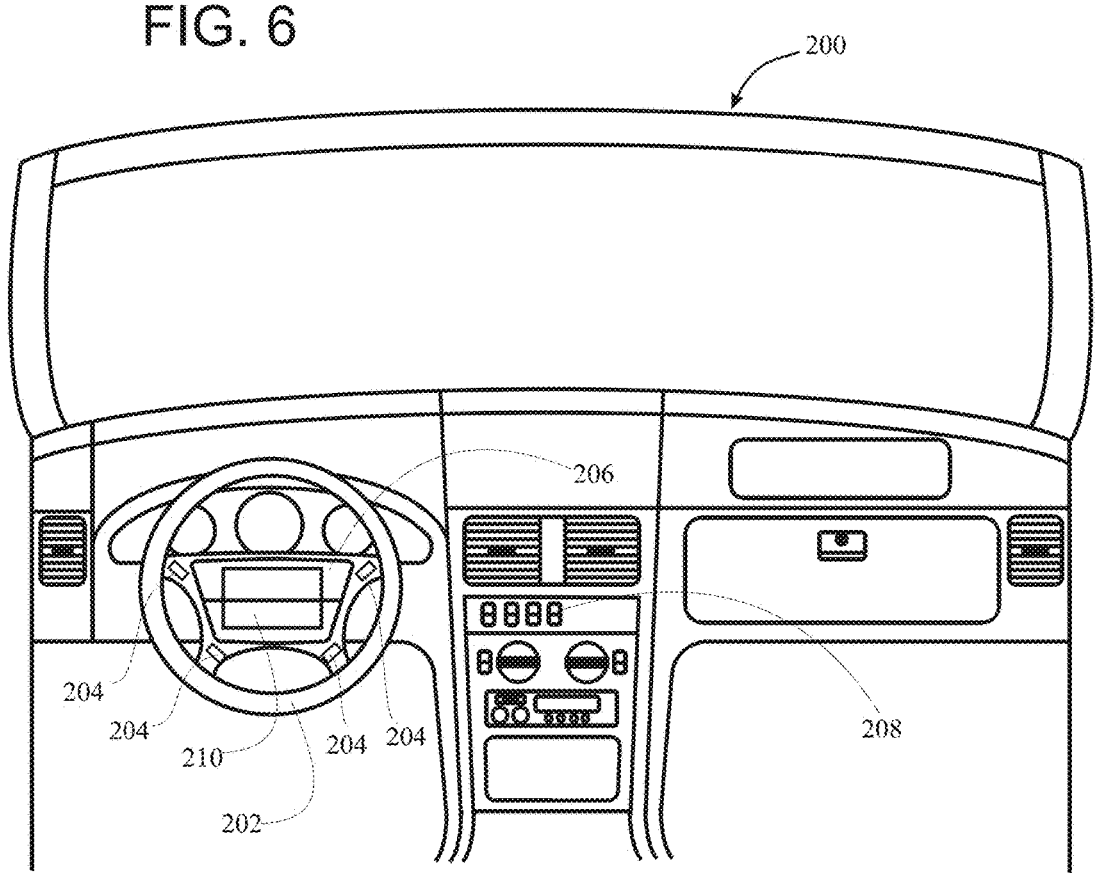
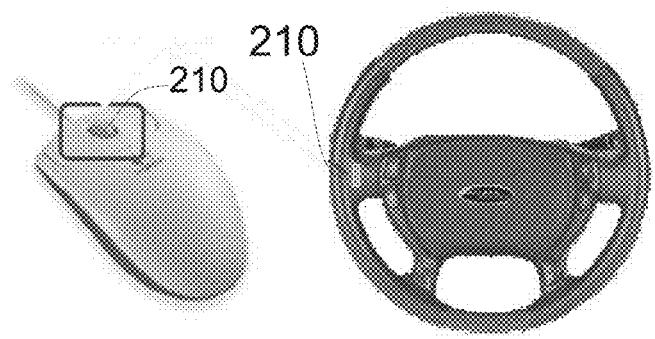
FIG. 7

US 10,033,381 B2

WIRELESS SWITCHES USING HUMAN BODY AS A CONDUCTOR

CROSS-REFERENCE TO RELATED APPLICATION

This application is a continuation of International Application No. PCT/US2015/059884 filed Nov. 10, 2015 which claims priority of U.S. provisional patent application Ser. No. 62/079,685 filed Nov. 14, 2014, and U.S. patent application Ser. No. 14/932,083 filed Nov. 4, 2015, now U.S. Pat. No. 9,475,438, all of which are incorporated by reference herein.

FIELD OF THE INVENTION

The present invention relates generally to systems and methods that use the human body as a means for wirelessly transferring energy to provide power to operate an electronic device such as an RFID. In particular, the present invention relates to systems and methods for controlling vehicular components using wireless switch assemblies powered by transmitting energy through a human body.

BACKGROUND OF THE INVENTION

In a vehicle, wires and connectors are the biggest source of warranty repairs. During the manufacture of a vehicle, the wire harness cost is a significant portion of the total manufacturing cost. Many, if not most, of these wires and connectors are associated with switches. Wireless switches based on RFID technology have been proposed by the inventor of this invention in, for example, U.S. Pat. No. 7,103,460. Such RFID technology suffers from the limited range of passive RFID devices requiring interrogator antennas to be close to the switch, or expensive interrogators to be used. This complicates the system and removes many of the advantages of the wireless technology. RFID interrogators have now been developed with a range of up to 20 feet; however, they are expensive. What is needed therefore is a method of providing energy to passive RFID devices which can be used as switches. The invention disclosed herein uses a transmitter located in the vehicle seat to provide the energy to power various RFID switches with that energy being transmitted through the body of the vehicle occupant.

Technical papers and other published documents that are particularly relevant to the inventions described herein include:

1. J. Smith, T. White, C. Dodge, J. Paradiso, N. Gershenfeld, D. Allport "Electric Field Sensing for Graphical Interfaces". 1998, IEEE Comput. Graph. Appl.
2. "Location Privacy And Wireless Body Area Networks", The Physics asXiv Blog, MIT Technology Review, Mar. 23, 2011.
3. J. A. Paradiso, N. Gershenfeld, "Musical Applications of Electric Field Sensing", Computer Music Journal 1997.
4. Kate Greene, "Talking to the Wall", MIT Technology Review May 3, 2011.

U.S. patents that are particularly relevant to inventions described herein include the following in addition to those referenced in the text:

5. U.S. Pat. No. 6,684,973, entitled "Occupant detecting apparatus";
6. U.S. Pat. No. 6,816,077, entitled "Multiple sensor vehicle occupant detection"; and
7. U.S. Pat. No. 6,960,841, entitled "Passenger detection system and detection method".

Possible definitions of terms used in the application are set forth in U.S. Pat. Nos. 7,663,502 and 7,889,096, both of which are incorporated by reference herein.

SUMMARY OF THE INVENTION

An embodiment of this invention includes a vehicle including a seat on which an occupant sits during use of the vehicle, and a system for using the occupant in the seat to convey or otherwise provide energy emanating from an antenna in the seat to operate an electrical circuit and thereby adjust, change or vary the state, condition and/or operation of a vehicular component. The system includes at least one electric field antenna emitting radio frequency radiation from the seat as a signal which passes through or is conducted by the body of the occupant to provide energy to operate the desired electrical circuit when a conductive surface forming part of the electrical circuit is touched or approached by the occupant. The occupant's finger initiates a capacitive coupling with the conductive surface either through touch or contact therewith, or by being within a threshold distance to enable capacitance to develop between the finger and the conductive surface. In the former situation, the conductive surface may be exposed to contact with the occupant's finger and in the latter situation, the conductive surface may be covered by an insulating material that is exposed.

Each vehicle seat contains a set of antennas, each set including at least one antenna. The antennas are electrically attached to control and driving circuitry which causes the antenna set to emit waves at one or more radio frequencies directed as a signal toward the occupant's body, which in turn, transmits the RF waves as a signal throughout the body and into the occupant's fingers. When the occupant desires to activate a vehicle component, such as to open a window for example, he or she moves their finger close to and possibly in contact with the conductive surface of an electronic or electrical circuit, such as an RFID device or transponder, and the occupant's finger completes the circuit and thereby provides power in the form of the RF signal which is rectified to operate the RFID device. The RFID device can then emit a wireless signal carrying its unique identification message. A receiver located at a convenient location in the vehicle receives the RFID-emitted wireless signal and causes the vehicle component to perform the desired function, such as opening the window.

This invention can be used to eliminate all wires to switches in the vehicle thereby eliminating much of the vehicle wiring and reducing the cost and weight of the vehicle and increasing its reliability. Since all electrically activated components in the vehicle require electricity to operate, the command to open a window, for example, can be transmitted from the controller either through a vehicle bus, wirelessly or via the electrical power line or in any other convenient manner.

A method for enabling an occupant of a vehicle to control a component in the vehicle in accordance with the invention includes directing at least one antenna in a first set of at least one electric field antenna arranged in a seat on which the occupant sits to transmit an oscillating electric field as a signal at a frequency that enables the electric field to be conducted through a body of the occupant when sitting on the seat. When the antenna is generating the oscillating electric field conducted as a signal through the occupant, a capacitive coupling can develop between the occupant and a conductive surface in a position accessible by a finger of the occupant when the finger of the occupant is proximate or in contact with the conductive surface. The capacitive coupling completes an electrical circuit coupled to the component, and the component is adjusted based on completion of the electrical circuit by the finger of the occupant. Adjustment may entail varying or changing the state, condition and/or operation of the component. This may be based on the conductive surface approached or contacted by the occupant's finger.

BRIEF DESCRIPTION OF THE DRAWINGS

The following drawings are illustrative of embodiments of the system developed or adapted using the teachings of at least one of the inventions disclosed herein and are not meant to limit the scope of the invention as encompassed by the claims.

FIG. 6 is a view of the front of a passenger compartment of a vehicle showing wireless switches and a touch pad mounted on the steering wheel and various dashboard-mounted wireless switches.

FIG. 7 illustrates a wireless mouse mounted on the steering wheel.

DETAILED DESCRIPTION OF THE INVENTION

All patents or literature referred to anywhere in this specification are incorporated by reference in their entirety. Also, although many of the examples below relate to a particular vehicle, an automobile, the invention is not limited to any particular vehicle and is thus applicable to all relevant vehicles including all compartments of a vehicle including, for example, the passenger or other compartment of an automobile, truck, farm tractor, construction machine, train, airplane and boat.

"Or" and "and" as used in the specification and claims shall be read in the conjunctive and in the disjunctive wherever they appear as necessary to make the text inclusive rather than exclusive, and neither of these words shall be interpreted to limit the scope of the text.

An electric field monitoring system is a particularly useful technique for wireless switches especially since it is now in production as an occupant presence and position sensor by Honda Elesys and others. An adaptation of the Honda Elesys system can be used, as illustrated below and in U.S. Pat. No. 8,725,311 to allow the use of wireless switches.

Figure 1:
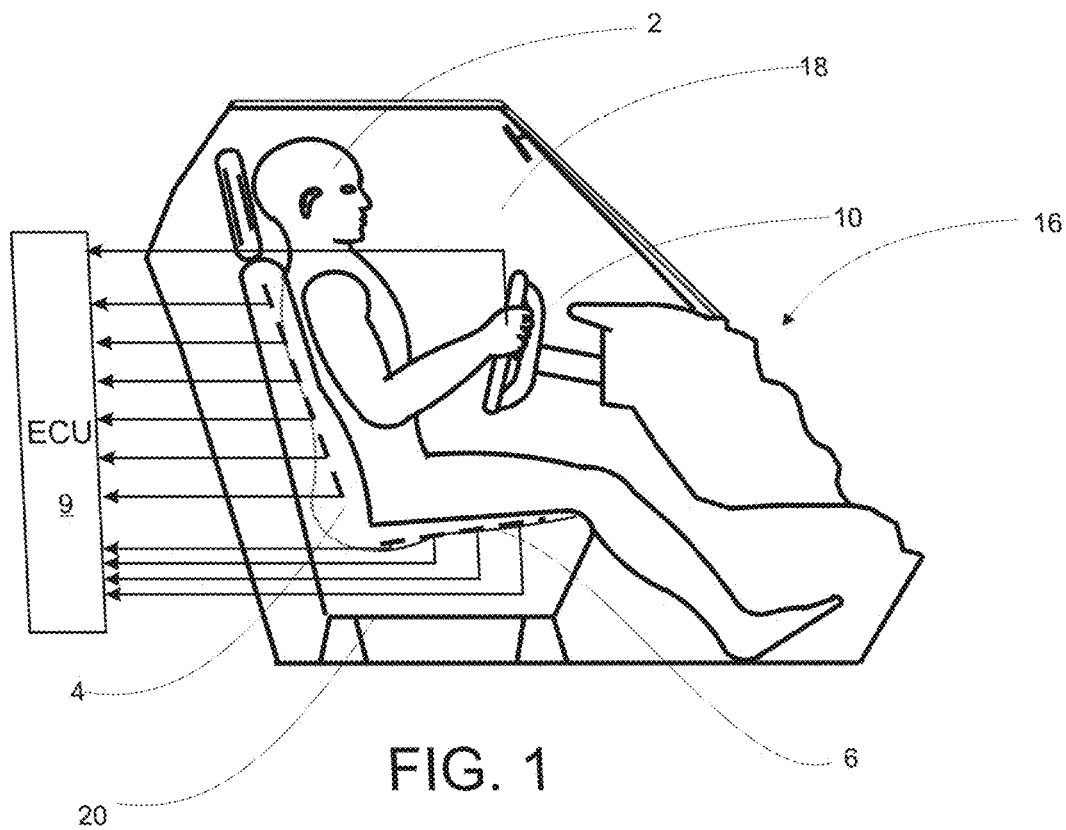
FIG. 1 is a side view with parts cutaway and removed of a vehicle showing a passenger compartment containing a driver sitting on a vehicle seat which contains a plurality of electric field antennas in accordance with a first embodiment of the invention.

Referring now to the accompanying drawings, FIG. 1 is a side view, with parts cutaway and removed of a vehicle 16 showing a passenger compartment 18, or passenger container, containing a driver 2 operating the vehicle 16 and sitting in a seat 20. Embedded in the seat 20 or as part of the seat cover material are two sets of electric field antennas 4 and 6. The manner in which each set of electric field antennas 4, 6 can be embedded in the seat 20 may be by placing the electric field antennas 4, 6, in the cushion material of the seat 20. To make the electric field antennas 4, 6 of the sets thereof part of the seat cover material, electrically conductive material may be woven into the material of the seat cover or arranged on the material of the seat cover. Other alternatives include placing a conductive mat in the seat 20 just below the seat cover material or, in some cases, using the seat heating wires as an antenna. There are thus many ways that an area of a seat 20 can be made conductive and to function as an antenna. The design of a particular antenna depends on the wavelength of the signal being emitted and is well understood in the art.

Figure 2:
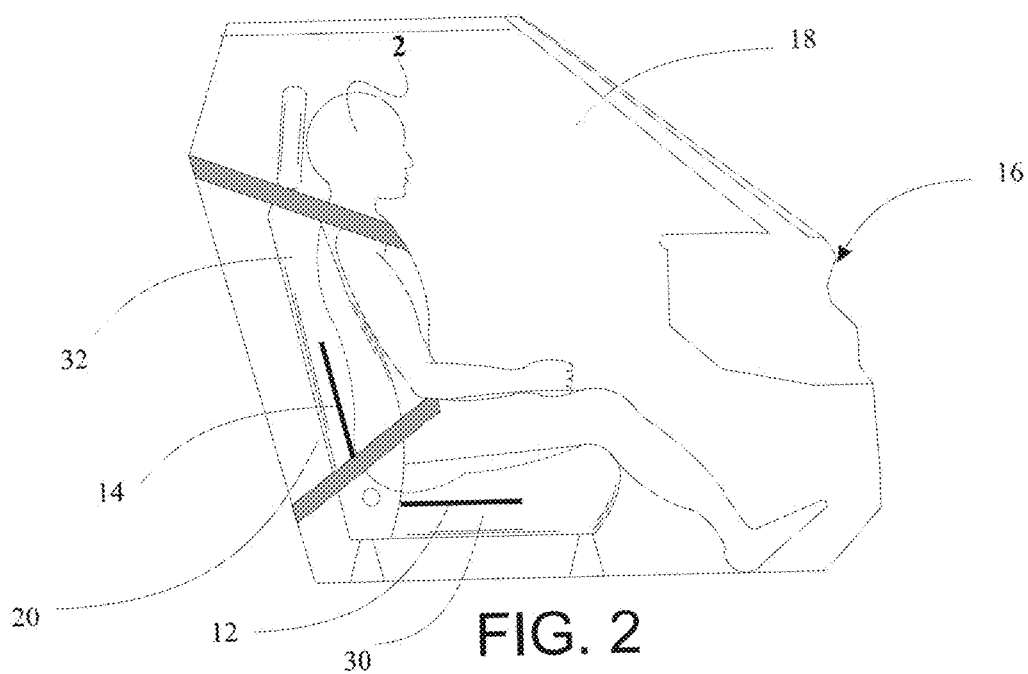
FIG. 2 illustrates the use of a single pair of antennas.

Each set of electric field antennas 4, 6 can have any appropriate number of individual antennas such as from 1 to about 20. Antenna set 4 is illustrated with 7 antennas and antenna set 6 with 5 antennas. FIG. 2 illustrates an embodiment where a single antenna 12 is placed in the seat bottom portion 30 and a second, single antenna 14 is placed in the seat back portion 32. The seat bottom portion 30 is that portion of the seat 20 on which the driver 2, or other occupant, sits while the seat back portion 32 is that portion of the seat 20 against which the seat occupant's back rests.

An embodiment is possible wherein there is only a single set of antennas (one or more antennas in this set) in the seat bottom portion 30 or the seat back portion 32. Thus, an antenna in the seat bottom portion 30 can suffice to enable the invention to function and convey an oscillating electric field as a signal through the driver 2 (although FIG. 1 shows the system for a driver 2, the system is equally applicable for any occupants in the vehicle, including passengers, and hereinafter reference to a driver does not limit the use of the invention to the person operating the vehicle).

Each of the antennas 4,6 is connected to an electronic control unit (ECU) 9 which includes the oscillating electric field generating circuits (see FIG. 1). ECU 9 includes software and hardware known to those skilled in the art, such as a processor unit and signal processing circuitry and software embodied on non-transitory computer-readable media to implement the functions described herein. As used herein, a "control unit" will generally mean any component or combination of components that is capable of processing input data and/or signals for an identified purpose, and generating from the data and/or signal processing, commands or signals to be directed to over one or more other electronic components to be controlled. A control unit in accordance with the invention may have other functions, e.g., to generate signals to be transmitted via a communications system. Also, as used herein, an "antenna" may be considered any conductive surface that is positioned close to the occupant of the seat 20. Such a conductive surface could be the source from which an electric field is transmitted or conveyed to the occupant. An antenna does not have to have any particular geometry, although it would operate in a preferred manner if it were "tuned" to the wavelength that is being transmitted.

Figure 3:
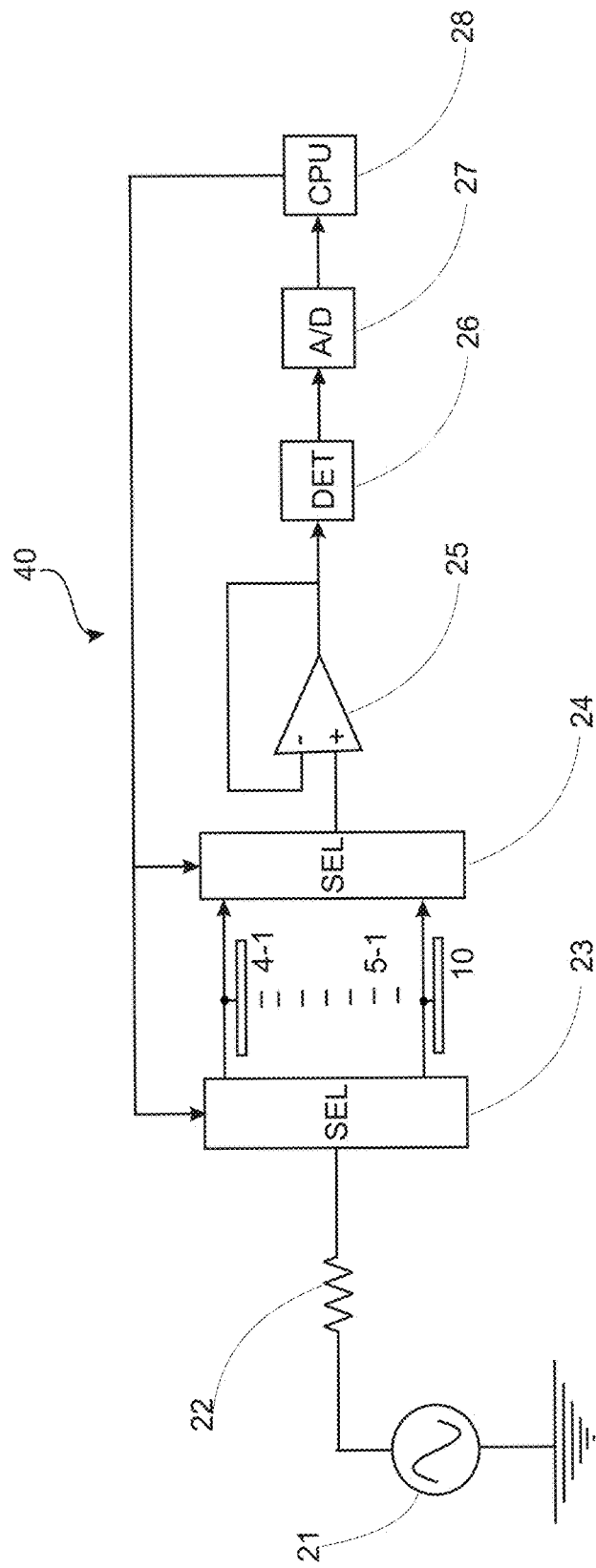
FIG. 3 is a block circuit diagram of the electric field sensing system of FIG. 1.

A representative circuit block diagram of the ECU 9 is illustrated generally at 40 in FIG. 3 for the sets of antennas illustrated in FIG. 1. One skilled in the art would understand how to implement this circuit block diagram in a commercial electronic package.

In the circuit block diagram 40, an oscillator 21 operating in a frequency range of, for example, about 30 kHz to 100 kHz or from about 30 KHz to about 10 MHz is attached to a resistor component 22, a pair of selection switches 23 and 24 each on a respective side of the antennas, a voltage buffer 25 connected to selection switch 24, a detector 26 receiving output from voltage buffer 25, an A/D converter 27 for converting analog data from detector 26 to digital signals, and a processor 28 connected to the A/D converter 27 for processing the digital signals therefrom. Processor 28 controls the selection switches 23, 24. The antennas in the seatback or seat back portion 32 (antenna set 4) are labeled 4-1 through 4-7 and the antennas in the seat bottom or seat bottom portion 30 (antenna set 6) are labeled 5-1 through 5-5. Not all antennas are individually labeled in FIG. 3, e.g., antenna 10.

One function of the selection switches 23, 24 or selectors is to choose that combination of sending and receiving antennas based on the morphology of the occupant (driver 2) to provide the best coupling between the generated RF signals and the body of the occupant (driver 2). By control of the selection switches 23, 24 by processor 28, it is possible to select a specific one or multiple ones of the antennas in one set or both sets to generate RF waves or signals.

Instead of selection switches 23, 24, any type of selection device or selection means that performs the same function as selection switches 23, 24 may be used in the invention and for some implementations such selector switches may not be required. The morphology of the occupant (driver 2) can affect the current to the antenna sets 4, 6. By monitoring such current, the presence of a body near the antenna can be determined and the power to a particular antenna can be turned off if a body is not adjacent to the antenna. Additionally, the power to all of the antennas can be turned off if the seat 20 is unoccupied.

An excellent background for the functioning of electric field occupant sensors is provided in U.S. Pat. Nos. 6,684, 973 and 6,960,841 as well as others assigned to Elesys and Honda covering electric field occupant sensing and others assigned to Automotive Technologies International, Inc., (ATI) and to American Vehicular Sciences LLC (AVS) mentioned herein. Whereas Elesys, ATI and AVS primarily use this technology for identifying the occupancy of the passenger seat for the purposes of airbag suppression or depowered deployment, the purpose here is to use the technology in an altogether different manner to transfer power to operate wireless switches.

In current airbag systems, the driver often does not need to be classified for the purpose of airbag suppression so there is no need to install an electric field occupant monitor in the driver's seat. It is typically assumed that the driver has the characteristics of an adult and that the airbag does not need to be suppressed unless the driver's seat is positioned far forward indicating that the driver is a small adult (a position-based determination of airbag suppression or control). This can be determined by a seat track sensor. Thus, previously, electric field sensors have not been installed in the driver seat for driver monitoring. Of course, if they are installed for powering wireless switches as in the invention, they can also be used for occupant out-of-position sensing at little, if any, additional cost.

Figure 4:
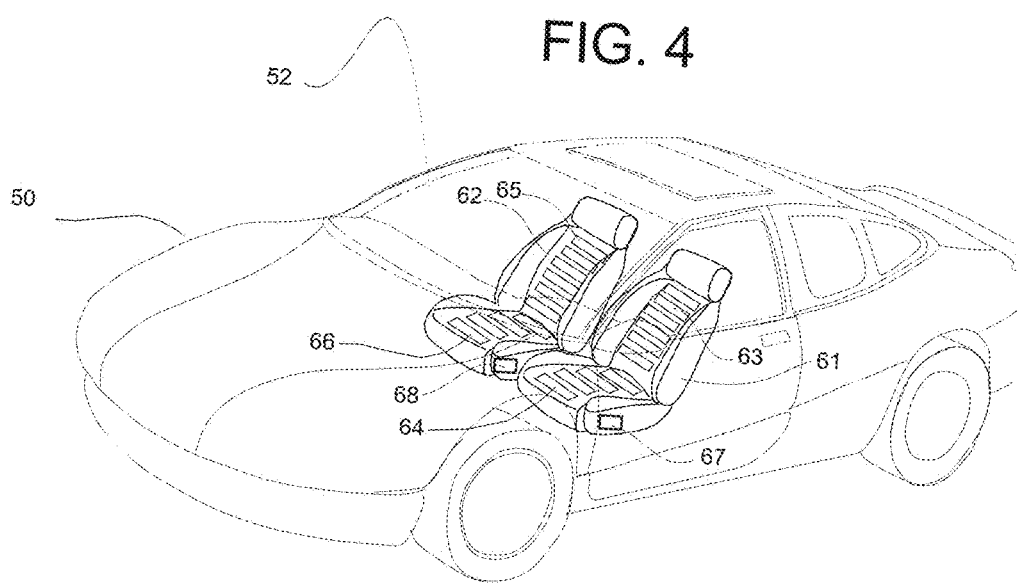
FIG. 4 is a perspective view with parts cutaway and removed of a vehicle showing a passenger compartment containing an electric field power transmission system on both the driver and passenger seats in accordance with a second embodiment of the invention.

A perspective view with parts cutaway and removed of a vehicle 50 showing a passenger compartment 52 containing electric field occupant sensing systems associated with both driver and passenger seats 61, 62, respectively, is illustrated in FIG. 4. Although the systems are shown to be the same on the driver and passenger seats 61, 62, in fact, their primary function and mode of operation may be different and this may dictate a different antenna arrangement for the seats 61, 62. Antenna sets or groups 65 and 66 associated with the passenger seat 62 can primarily be occupant classification sensors for the purpose of determining, for example, whether there is a child or a rear-facing child seat present or if the seat is unoccupied, in which case, the airbag(s) for protecting the passenger seat occupant in the event of a crash involving the vehicle 50 will be suppressed or perhaps depowered. Antenna groups 65, 66 may be integrated into the passenger seat 62 in the same manner as antennas of the antenna sets 4, 6 are integrated into the seat 20 (described above).

The electric field system associated with the driver seat 61 may be the same as that of the passenger seat 62, but the primary function can be to monitor the heartbeat and respiration rate to determine whether the driver occupying seat 61 is falling asleep, having a heart attack and/or is otherwise unable to operate the vehicle 50, as disclosed in U.S. Pat. No. 8,725,311. Processor 28, of the circuit block diagrams of the ECUs 67, 68 of the driver seat and passenger seat 61, 62, respectively, may be the same as or include the same circuit as circuit block diagram 40 shown in FIG. 3, and can execute different routines for the different uses of the antenna systems or groups 63-66. In both cases, the oscillating electric fields created by the antennas 63-66 can be used, as disclosed herein, as a part of a wireless switch system.

In FIG. 4, the passenger seat 62 has electric field antenna sets or groups 65 and 66 and the driver seat 61 has electric field antenna sets or groups 63 and 64. Antenna groups 63, 64 may be integrated into the driver seat 61 in the same manner as antennas of the antenna sets 4, 6 are integrated into the seat. Each seat 61, 62 can have its own ECU labeled 67 in or on the driver seat 61 and labeled 68 in or on the passenger seat 62. A single ECU could service both seats 61, 62 and the ECU(s) need not be located in the seats 61, 62. ECU's 67, 68 may be arranged on the respective seat 61, 62, in the respective seat 61, 62 or even separated from the seat 61, 62, in all cases, coupled through wires to the respective antenna groups. Passenger seat 62 may be in the row behind the driver seat 61.

In U.S. Pat. No. 8,725,311, FIGS. 6A-6C and the corresponding description illustrate and explain the principles of operation of a single electric field monitoring element in the presence of a body element and a modified body element, which principles may be used in any of the embodiments of the invention herein and are incorporated herein by reference.

In a similar manner, FIGS. 7A-7C of the '311 patent and the corresponding description illustrate and explain the principles of operation of a pair of interacting electric field monitoring elements in the presence of a body element and a modified body element and can be used to determine which antennas should be used.

As discussed in various U.S. patents such as U.S. Pat. Nos. 6,326,704, 7,079,450, 7,889,096, 7,760,080, 7,089, 099, 7,880,594, 7,786,864, 7,920,102, 7,467,034, 8,068,942 and 8,032,264, wires and connectors are not only expensive components to make and install in a vehicle, they are also the largest source of warranty repairs. Thus, there is a dire need to eliminate wires and connectors wherever possible. Much of this can be accomplished through use of electric field systems such as the Honda Elesys electric field occupant sensor discussed elsewhere herein. This invention can be implemented in many ways, only one of which will be discussed here. See U.S. Pat. No. 8,725,311 for an alternate implementation.

If a vehicle-wide power door lock switch normally present in the driver's door, for example, is replaced by an active RFID switch defining a conductive surface that the driver will interact with, then the power required to cause the RFID switch to be active can be provided from the seat antennas in the driver's seat through the occupant's body to his or her finger and to the RFID switch when the input terminal (conductive surface) of the RFID switch interacts with the occupant. Interaction between the conductive surface defined by the RFID may be contact of the occupant's finger with the conductive surface which may be exposed so that touch of the occupant's finger with the exposed conductive surface powers the RFID switch.

Alternatively, the conductive surface of the RFID switch may not be exposed but rather may be situated just below another exposed, covering or overlying material or substrate, e.g., an insulating surface formed by a material that itself is exposed and subject to contact by the occupant's finger. In this embodiment, the occupant's finger thus does not come into contact with or touch the conductive surface. Rather, there is a capacitive coupling between the occupant's finger and the conductive surface, which is possible when the distance between the occupant's finger and the conductive surface is in the order of about 0.1 inch. Generally then, there will be "capacitive interaction" between the occupant's finger and the conductive surface which may be either touch or contact between them or coupling over a small distance that enables capacitive coupling. A capacitive touchpad may thus be included in the RFID switch to facilitate its activation by the occupant.

The RFID switch can then transmit its ID, which is unique to each RFID, to an interrogator indicating that the occupant desires to lock or unlock all of the vehicle doors and the interrogator can cause that function to be performed. The RFID can begin transmitting the ID signal as soon as sufficient power is available from the capacitive interaction or, alternatively, a physical switch can be interposed to connect the power from the occupant's finger to the RFID thus providing the normal haptic response to the occupant that a switch is being depressed (actuated). One skilled in the art can now find or develop many other RFID switch and mechanical or circuit designs that would allow the normal switch function to be performed. The input terminal of the RFID switch can be any conductive pathway connecting the occupant's finger to the RFID circuitry. The duration of the transmission of the RFID signal, i.e., the duration of the capacitive interaction between the occupant's finger and the conductive surface or input terminal, can also be used when a variable effect is desired such as the partial opening or closing of a window.

Figure 5:
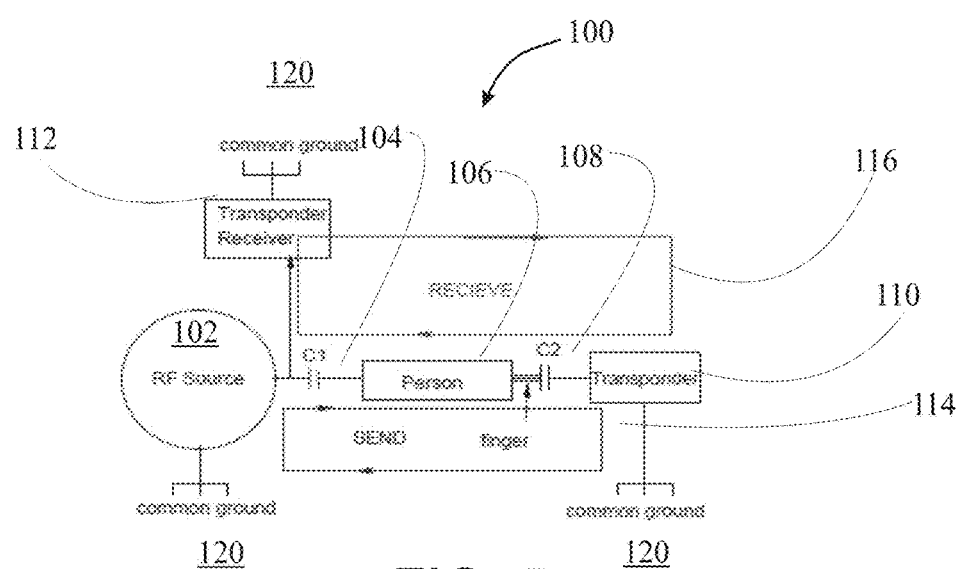
FIG. 5 is a schematic showing the operation of the system where an occupant transmits power in the form of a signal to operate a transponder.

FIG. 5 is a schematic showing operation of the system where an occupant transmits power in the form of a signal to operate a transponder, shown generally at 100. This schematic may incorporate an RFID switch as described above. Specifically, an RF source 102 is capacitively coupled to an occupant 106 as illustrated by capacitor 104. The RF source 102 may be the antennas in the seat as disclosed above. The RF source 102 also may influence a transponder receiver 112; however, this is unlikely due to a significant difference in frequency.

When the occupant 106 touches a transponder 110 again or capacitive interaction develops between the occupant 106 and the transponder 110, while the ECU associated with the antennas is causing one or more of the antennas to direct an oscillating electric field as a signal at a frequency that enables the electric field to be conducted through the occupant (shown in FIG. 1), there is a capacitive coupling through capacitor 108 to the transponder 110, and the transponder 110 sends a wireless message to the transponder receiver 112 when a conductive surface of the transponder 110 is touched or capacitive interaction develops between the occupant 106 and the transponder 110. The transponder 110 can be in the form of an RFID device or switch. The send cycle is depicted at 114 and the receive cycle at 116. All devices in the system may share a common ground 120.

In FIG. 5, the occupant 106 and the transponder 110, which may be an RFID tag, are shown with a common ground. Alternatively, the occupant 106 and transponder 110 may be only loosely connected to ground through a capacitive coupling, in which case, there is no wire from the occupant 106 or from the transponder 110 (RFID tag) to a common ground.

In this embodiment, the electrical circuit completed by the occupant includes the transponder 110 which may be placed in a position so that the conductive surface defined thereby can be contacted by the occupant 106 or more generally, capacitive interaction develops between the occupant 106 and the transponder 110. The transponder 110 is configured to send a wireless message when capacitive interaction is initiated by the occupant 106, which is represented by the capacitive coupling (provided by capacitor 108) between the occupant 106 and the transponder 110, when at least one of the antennas (of RF source 102) transmits an oscillating electric field conducted through the occupant 106. The electrical circuit also includes the transponder receiver 112 that is configured to receive the wireless message sent by the transponder 110 upon initiation of capacitive interaction by the occupant 106 when at least one of the antennas transmits an oscillating electric field conducted through the occupant 106.

FIG. 6 is a view of the front of the passenger compartment of an automobile showing wireless switches and a touch pad mounted on the steering wheel and various dashboard mounted wireless switches shown generally at 200. Several steering wheel-mounted sensors 204 and a steering wheel-mounted touchpad 210 are illustrated mounted on a steering wheel 202. Sensors 204 and touchpad 210 may each be part of an electrical circuit and define a conductive surface to be contacted by the occupant to effect control of a vehicular component, and thus constitute switches in accordance with the invention (as shown in FIG. 5).

By making all of these switches wireless, and if the airbag ECU communicates with steering wheel-mounted airbags 206, a clock spring connector between the steering wheel and the steering column through which switch and airbag information currently passes can be eliminated. For the airbag, it would be required to have energy sufficient to deploy the airbag stored in a capacitor on the steering wheel 202. Energy would still be required to charge this capacitor, but this could also be done wirelessly through an inductive power transfer between the steering column and the steering wheel 202. A bank of four switches is also illustrated at 208 showing that wireless switches can also be used on the instrument panel. FIG. 7 illustrates a wireless mouse 210 mounted on the steering wheel.

Figure 9:
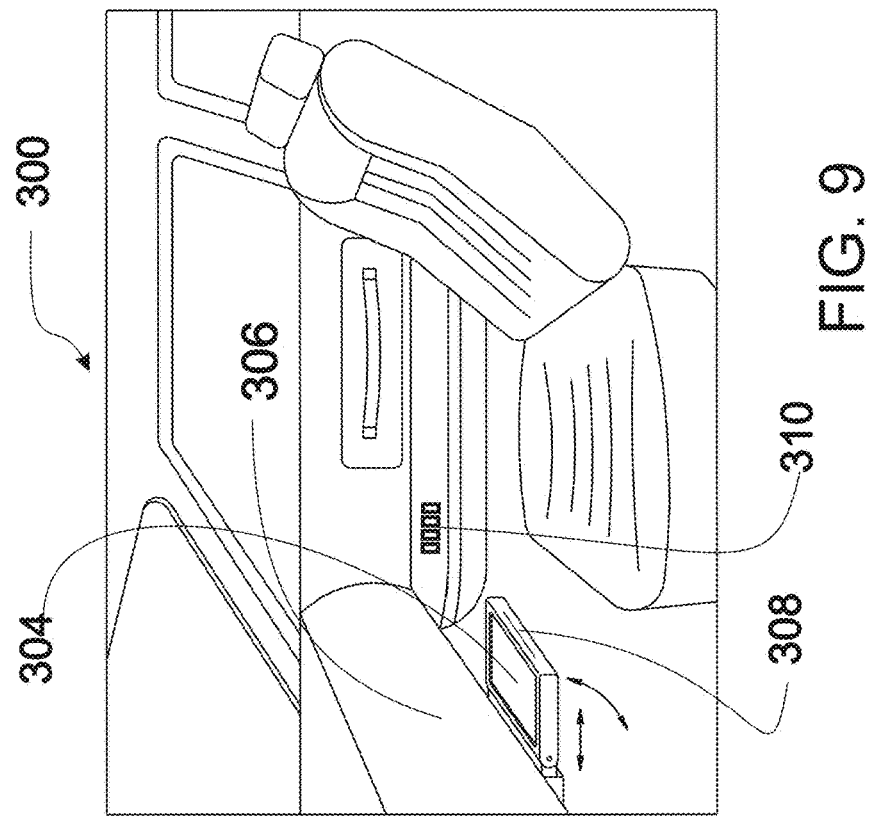
FIGS. 8 and 9 show other interior surfaces where touch pads can be placed such as on the armrest (FIG. 8) or projecting out of the instrument panel (FIG. 9).
Figure 8:
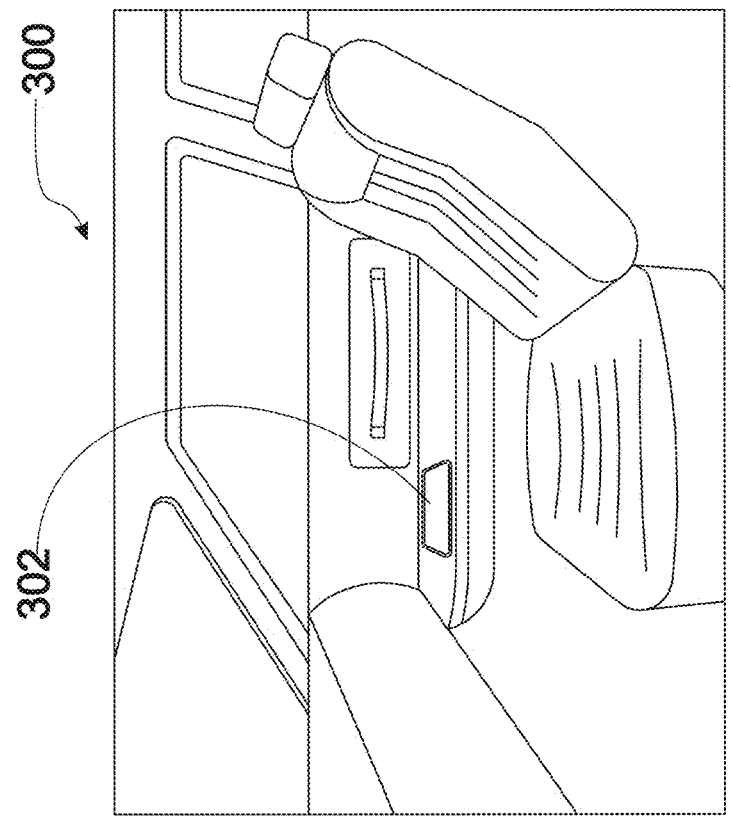

The interior of a passenger vehicle is shown generally at 300 in FIGS. 8 and 9, along with alternate positions for touch pads, in this case for the convenience of the passenger. Each touchpad may be part of an electrical circuit and define a conductive surface to be initiated by capacitive interaction by the occupant to effect control of a vehicular component.

One touch pad 302 is shown mounted on an armrest within easy reach of the right hand of the passenger (FIG. 8). A second touch pad 304 projects out from an instrument panel 306. When not in use, this assembly can be stowed in the instrument panel 306 out of sight. When the passenger intends on using the touch pad 304, he or she will pull the assembly, including the touch pad 304, by handle 308 bringing the touch pad 304 toward him or her. For prolonged use of the touch pad 304, the passenger can remove the touch pad 304 from the cradle and even stow the cradle back into the instrument panel 306. Touch pad 304 can then be operated from the lap of the passenger. In this case, the communication of the touch pad 304 to the vehicle is done by either infrared or radio frequency transmission or by some other convenient wireless method or with wires. The touchpads 302, 304 in FIGS. 8 and 9 can derive their power in the same manner as the switches described above. The finger of the occupant carries power from the antenna in the seat to the touchpad 302 or 304. Commands provided on the touchpads 302 and 304 can be transmitted wirelessly to the vehicle in the same manner as described above. A bank of switches 310 can also be mounted in the armrest or elsewhere for wirelessly controlling vehicle complements such as the windows, door locks etc.

A general discussion of electromagnetic occupant sensors appears in other of the patents and patent applications mentioned above having a common inventor and is not repeated here. Such patent publications discuss the interaction between electric fields and vehicle occupants primarily of the purpose of occupant sensing. This is a different use of electric fields than contemplated here but nevertheless provides relative background information.

A detailed discussion of the use of the human body as a means for transferring electrical energy as a signal in the range of about 30 kHz to about 100 kHz is discussed in papers referenced above and in particular reference 1, and therefore is not repeated here.

Among the inventions disclosed above is a vehicle including a system for using the body of an occupant to convey (transmit) power from one or more closely coupled antennas to an electronic or electrical circuit which can thereafter wirelessly transmit to an interrogator, information related to the function desired by the occupant. This information may be converted into action relating to a vehicular component. The vehicle in accordance with the invention includes a frame, one or more electric field transmitting antennas and an electrical or electronic circuit which when interaction with a conductive surface of a component in this circuit is initiated by the occupant, responds by, for example, transmitting a wireless signal to an interrogator which in turn causes the desired vehicular component control.

A primary method disclosed above involves expanding in what is considered to be an unobvious manner, use of electric field (EF) sensors such as being marketed by Honda Elesys for detection and classification of passenger occupants in a vehicle for the purpose of airbag suppression. In the '311 patent referenced above, the measurement of heart and respiration rates and their variability and anomalies, other non-obvious uses have been disclosed, such as for communication to a vehicle system using gestures and the elimination of wires associated with vehicle switches. These make use of several properties of electric fields including operation in the loading, transmitting and shunting modes. (Musical Applications of Electric Field Sensing, April, 1996). The present invention extends the above-referenced applications to the use of the human body to convey (transmit) power to provide the energy needed to operate an electrical circuit capable of, for example, emitting a wireless signal when such power is provided.

Methods described herein can be combined with those provided in the '311 patent for using the heartbeat and respiration rates for determining drowsiness and which, in turn, can be combined with each other as well as with other methods, disclosed herein or elsewhere, or otherwise known or applied in the field to which this invention pertains. Although a primary application of the technology disclosed above is for automotive wireless switches, other applications are to apply the technology to airplane pilot and train conductors (or more generally vehicular operators) and other passengers in automobiles and planes (or more generally vehicular occupants) to enable wireless switching.

Although several preferred embodiments are illustrated and described above, there are possible combinations using other geometries, sensors, materials and different dimensions for the components that perform the same functions. At least one of the inventions disclosed herein is not limited to the above embodiments and should be determined by the following claims. There are also numerous additional applications in addition to those described above. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the following claims.

The invention claimed is:

1. A control arrangement, comprising:
   a device that generates a signal at a frequency that enables the signal to be conducted through a body of a human;
   a first switch comprising:
      a conductive surface situated in a position accessible by a part of the human, said conductive surface being configured to enable proximity or contact of the part of the human to said conductive surface to develop a reactive coupling between the human and said conductive surface while said device is generating the signal, and
      a radio frequency identification device (RFID) that receives power only when the part of the human is in proximity to or in contact with said conductive surface while said device is generating the signal, and said RFID generating an identification signal when receiving power and which identification signal is transmitted from said first switch; and
   a first component having multiple, different states, said first component being controllable based on the identification signal transmitted from said first switch to change from a first one of the states to a second one of the states only upon completion of an electrical circuit including said device and said first switch upon developing reactive coupling between the human and said conductive surface while said device is generating the signal, whereby the electrical circuit is not completed unless the part of the human is in proximity to or in contact with said conductive surface.

2. The arrangement of claim 1, wherein said first switch includes a capacitor that is charged by the completion of the electrical circuit including said device and said first switch upon developing reactive coupling between the human and said conductive surface while said device is generating the signal such that the reactive coupling is a capacitive coupling and said conductive surface is configured to enable proximity or contact of the part of the human to said conductive surface to develop the capacitive coupling between the human and said conductive surface while said device is generating the signal.

3. The arrangement of claim 1, wherein said device comprises:
   a first set of at least one antenna; and
   at least one control unit coupled to said first set of at least one antenna and configured to direct said at least one antenna in said first set of at least one antenna to cause the signal to be generated.

4. The arrangement of claim 1, wherein said conductive surface is exposed and configured to enable contact of the part of the human with said conductive surface to develop the reactive coupling between the human and said conductive surface.

5. The arrangement of claim 1, further comprising material that covers said conductive surface and said conductive surface is configured to enable proximity of the part of the human to said conductive surface to develop the reactive coupling between the human and said conductive surface through said material.

6. The arrangement of claim 1, wherein said device comprises an oscillator.

7. The arrangement of claim 1, wherein said device comprises:
   a first set of at least one antenna;
   a second set of at least one antenna physically separated from all of said antennas in said first set of at least one antenna; and
   at least one control unit coupled to said first and second sets of at least one antenna and configured to direct said at least one antenna in each of said first and second sets of at least one antenna to cause current to be conducted through the body of the human.

8. The arrangement of claim 1, wherein said device comprises:
   a first set of at least one antenna;
   a second set of at least one antenna physically separated from all of said antennas in said first set of at least one antenna; and
   at least one control unit coupled to said first and second sets of at least one antenna and configured to direct said at least one antenna in each of said first and second sets of at least one antenna to cause the signal to be generated.

9. The arrangement of claim 8, wherein each of said antennas has a function state and a non-functioning state, said at least one control unit is configured to select at least one of said antennas to change from the non-functioning state into the function state based on morphology of the human.

10. The arrangement of claim 8, wherein each of said first and second sets of antennas is housed in a separate housing.

11. The arrangement of claim 8, wherein each of said first and second sets of antennas comprises a plurality of antennas.

12. The arrangement of claim 1, further comprising a seat, said device being arranged in said seat.

13. The arrangement of claim 1, wherein said first component is a vehicular component.

14. The arrangement of claim 1, wherein said first component is a door in a vehicle.

15. The arrangement of claim 1, wherein said first component is a window in a vehicle.

16. The arrangement of claim 1, further comprising a transponder receiver that receives the identification signal transmitted from said first switch.

17. The arrangement of claim 1, wherein said first component is controllable based on duration of a transmission of the identification signal from said first switch which is based on duration of the reactive coupling between the human and said conductive surface while said device is generating the signal to thereby provide variable control of said first component dependent on the duration of the proximity or contact of the part of the human to said conductive surface.

18. The arrangement of claim 1, wherein said RFID transmits the identification signal through the body of the human when the part of the human is in proximity to or in contact with said conductive surface and the reactive coupling between the human and said conductive surface develops while said device is generating the signal.

19. The arrangement of claim 1, further comprising:
   a second switch comprising:
      a conductive surface situated in a position accessible by the part of the human, said conductive surface being configured to enable proximity or contact of the part of the human to said conductive surface to develop a reactive coupling between the human and said conductive surface while said device is generating the signal, and
      a radio frequency identification device (RFID) that receives power only when the part of the human is in proximity to or in contact with said conductive surface of said second switch while said device is generating the signal, and said RFID of said second switch generating an identification signal when receiving power and which identification signal is transmitted from said second switch,
      the identification signal generated by said RFID of said second switch being different than the identification signal generated by said RFID of said first switch; and
   a second component having multiple, different states, said second component being controllable based on the identification signal transmitted from said second switch to change from a first one of the states to a second one of the states upon completion of an electrical circuit including said device and said second switch upon developing reactive coupling between the human and said conductive surface of said second switch while said device is generating the signal,
   said second component being different than said first component.

20. A control arrangement for controlling a plurality of components, each of the components having multiple, different states, the arrangement comprising:
   a device that generates a signal at a frequency that enables the signal to be conducted through a body of a human; and
   a plurality of switches, each of said switches comprising:
      a conductive surface situated in a position accessible by a part of the human, said conductive surface being configured to enable proximity or contact of the part of the human to said conductive surface to develop a reactive coupling between the human and said conductive surface while said device is generating the signal, and
      a radio frequency identification device (RFID) that receives power only when the part of the human is in proximity to or in contact with said conductive surface while said device is generating the signal, and said RFID generating a unique identification signal when receiving power and which identification signal is transmitted from said switch, whereby each of the components is controllable based on the identification signal transmitted from a respective one of said switches to change from a first one of the states to a second one of the states upon completion of an electrical circuit including said device and said respective one of said switches upon developing reactive coupling between the human and said conductive surface of said respective one of said switches while said device is generating the signal, the electrical circuit not being completed unless the part of the human is in proximity to or in contact with said conductive surface of said respective one of said switches.

* * * * *